United States Patent
Iovdalsky

[19]
[11] Patent Number: 6,115,255
[45] Date of Patent: Sep. 5, 2000

[54] HYBRID HIGH-POWER INTEGRATED CIRCUIT

[75] Inventor: Viktor Anatolievich Iovdalsky, Moskovskaya obl., Russian Federation

[73] Assignee: Samsung Electronics Co., Ltd., Rep. of Korea

[21] Appl. No.: 09/077,987

[22] PCT Filed: Oct. 10, 1996

[86] PCT No.: PCT/RU96/00293

§ 371 Date: Oct. 25, 1999

§ 102(e) Date: Oct. 25, 1999

[87] PCT Pub. No.: WO98/15980

PCT Pub. Date: Apr. 16, 1998

[51] Int. Cl.[7] ........................................ H05K 7/20
[52] U.S. Cl. .................. 361/705; 257/796; 361/761
[58] Field of Search .................................. 257/788, 789, 257/796, 706, 713; 124/16.3, 252; 165/80.3, 185; 361/704, 705, 707, 708, 713, 717–719, 761

[56] References Cited

U.S. PATENT DOCUMENTS 4,729,061  3/1988  Brown .
4,731,701  3/1988  Kuo .
4,737,235  4/1988  Scannell .
5,309,322  5/1994  Wagner .
5,646,828  7/1997  Degani .
5,687,062  11/1997 Larson .
5,835,356  11/1998 Wieloch .
5,866,952  2/1999  Wojharowski .

*Primary Examiner*—Gerald Tolin
*Attorney, Agent, or Firm*—Piper Marbury Rudnick & Wolfe

[57] ABSTRACT

The circuit comprises a dielectric board (1) metallized on both sides and comprising a topological metallization pattern (2) on the face side thereof and with at least one mounting pad (3) located in a recess (4) of the face side of the board (1) on a heat sink (5). A naked electronic chip (9) is placed on and fixed to a mounting pad (3) in such a manner that its face surface is coplanar with the topological metallization pattern (2). The heat sink (5) is essentially a system of blind holes (6) provided in the bottom of the recess (4) and filled with a heat conducting material (10). The remained thickness of the bottom of the blind holes (6) is from 1 to 999 $\mu$m. Spaces between the chip (9) and the side walls of the recess (4) are filled at least partially with the heat conducting binder (10). The back side of the board (1) is joined with the heat conducting base (7).

10 Claims, 3 Drawing Sheets

HYBRID HIGH-POWER INTEGRATED CIRCUIT

FIELD OF THE INVENTION

The present invention relates in general to electronic engineering and more specifically to a power hybrid integrated circuit.

BACKGROUND OF THE INVENTION

One prior-art power hybrid integrated circuit is known (U.S. Pat. No. 4,737,235), comprising dielectric board having a topological metallization pattern and a number of recesses, wherein semiconductor chips are fixed by means of a binder so that the surfaces of the chips having bonding pads are coplanar with the board surface, and the chip bonding pads are electrically connected to the topological metallization pattern.

The circuit construction mentioned above has a small area of chip-to-board heat transfer and hence an inadequate heat dissipating capacity.

One more prior-art hybrid integrated circuit is known (EP, A, 0334397), comprising a double-side metallized dielectric board with a topological metallization pattern on the face side and with at least one mounting pad located in a recess of the face board side on a heat sink which is essentially a system of holes in the recess bottom, the holes being filled with a heat conducting material. The board is joined with its back side to a heat conducting base, the naked electronic chip is placed on and fixed to the recess in the mounting pad so that the chip face surface is coplanar with the topological metallization pattern.

This circuit construction cannot make use of a broad range of semiconductor devices.

SUMMARY OF THE INVENTION

The principal object of the present invention is to provide a power hybrid integrated circuit having such a constructive arrangement of the heat sink that allows to improve conditions of the heat dissipation from the chip.

The foregoing object is accomplished due to the fact that in a power microwave hybrid integrated circuit, comprising a double-side metallized dielectric board with a topological metallization pattern on the face side thereof and with at least one mounting pad located in a recess of the board face side on a heat sink which is essentially a system of holes in the recess bottom, filled with a heat conducting material, the board is joined with its back side to a heat conducting base, the naked electronic chip is placed on and fixed to the recess in the mounting pad so that the chip face surface is coplanar with the topological metallization pattern, according to the invention, the heat sink holes in the bottom of the recess are blind, remained thickness of the bottom of said blind holes is from 1 to 999 $\mu$m, and spaces between the chip and the side walls of the recess are filled at least partially with the heat conducting material.

Arranging the heat conducting elements in the system of blind holes of the board made in the mounting pad and filled with a heat conducting binder makes it possible to extend simultaneously the field of application of the proposed circuit due to a possibility of providing such circuits that can incorporate a common-emitter or common-base bipolar junction transistor and of using the gap between the recess metallization and the shield metallization as a capacitor built into the board due to electrical insulation of the chip with remaining the heat dissipation therefrom.

At least partial filling of the spaces between the chip and the side walls of the recess with a heat conducting binder increases the heat-transfer area, thereby improving the heat dissipation from the chip.

The lower limit of the remained thickness of the blind hole bottom is dictated by the necessity to provide an electric insulation of the chip from the shield grounding metallization, while the upper limit thereof is dictated by a minimum attainable effect of increasing the heat-transfer area and hence of improving heat transfer conditions.

Providing opposing blind holes made on the back side of the board between the blind holes in the bottom of the recess and filled with a heat conducting material increases the heat-transfer area and hence increases the rate of heat dissipation from the chip. The remained dielectric thickness between the blind holes equals 1 to 500 $\mu$m.

The lower limit of the remained thickness of the dielectric between the blind holes is dictated by the necessity of providing electric insulation of the chip from the shield grounding metallization, while the upper limit thereof is dictated by a minimum attainable effect of improving heat-transfer from the chip to the heat conducting base.

Providing the system of blind holes in the form of a grate increases the heat contact area and hence improves the heat dissipation from the chip.

Providing blind slots filled with a heat conducting material and located on the board face surface along the recess perimeter increases the heat contact area and hence improves the heat dissipation from the chip.

Metallizing the recess, the blind holes, and the blind slots facilitates their filling with a heat conducting material due to better wettability and thereby promotes the heat contact.

BRIEF DESCRIPTION OF THE DRAWINGS

The present invention is illustrated by a detailed description of some specific exemplary embodiments thereof to be taken with reference to the accompanying drawings, wherein.

BEST METHOD OF CARRYING OUT THE INVENTION

Figure 1:
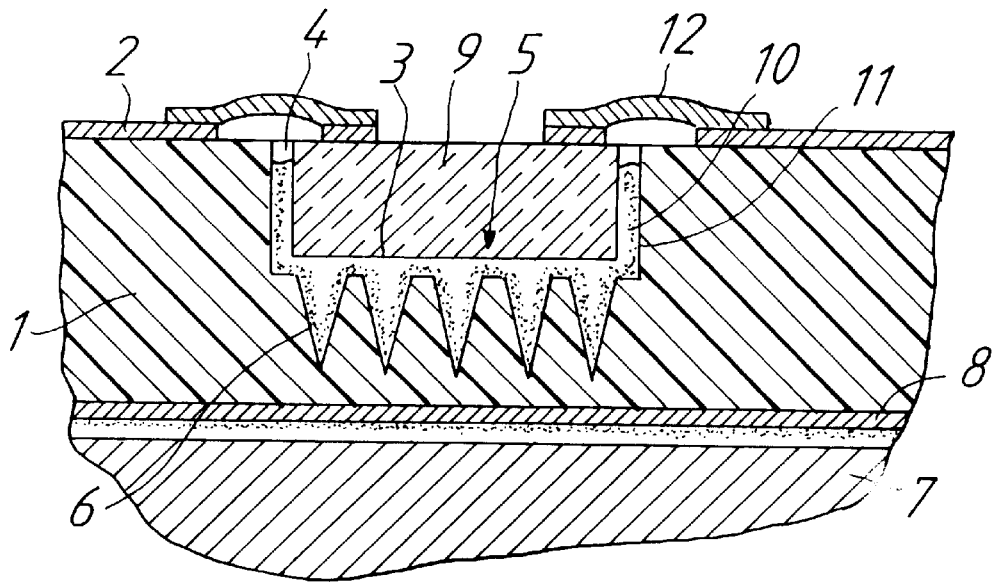
FIG.1 is a sectional view of a power hybrid integrated circuit.

The power microwave hybrid integrated circuit, according to the invention, comprises a dielectric board 1 (FIG.1) made of, e.g., Polycor and metallized on both sides. The board 1 has a topological metallization pattern 2 on the face side thereof the metallization having the following composition: Ti(100 Ohm/sq.mm)—Pd(0.2 $\mu$m)—Au (3 $\mu$m) or Cr (100 Ohm/sq.mm)—Cu (1 $\mu$m)—Cu (electrochemically deposited, 3 $\mu$m)—Ni (0.6 $\mu$m)—Au (3 $\mu$m).

The board 1 has one mounting pad 3 located in a recess 4 of 0.6×0.55×0.33 mm on a heat sink 5 which is essentially a system of blind holes 6 of the board 1 having a diameter of, e.g., 0.1 mm and a pitch of 0.2 mm. A plurality of the mounting pads 3 may be provided.

A heat conducting base 7 made of, e.g., an alloy МД–50 provided with a coating of the following composition: Ni (0.6 μm)—Au (3 μm) is joined up with a metallization 8 on the back side of the board 1 through, e.g., brazing. Naked electronic chips 9, e.g., the chips of transistors 3П603Б-5 of 0.5×0.15×0.3 mm are bonded to the mounting pad 3 and to the side face 11 of the recess 4 by a heat conducting binder 10, e.g., the eutectic Au-Si hard alloy and are electrically connected to the metallization pattern 2 through, e.g., a golden wire 12 having a diameter of 30 μm. The heat conducting binder 10 fills the blind holes 6 and, at least partially, the space between the chip 9 and the side walls of the recess 4. The remained thickness of the bottom of the blind holes 6 is selected to be 100 μm.

Figure 2:
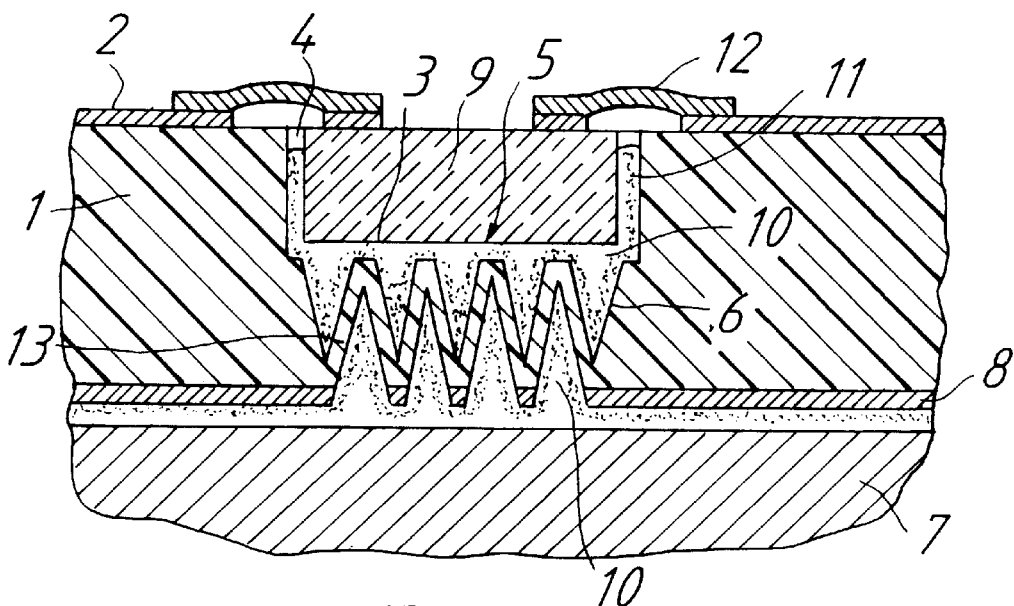
FIG.2 is a sectional view of a power hybrid integrated circuit with blind holes on the back side of the board thereof.

The back side of the board 1 (FIG.2) has opposing blind holes 13 made in the bottom of the recess 4 between the blind holes 6, said holes 13 having a diameter of, e.g., 50 μm and being filled with the heat-conducting material 10, such as the Au-Si hard solder. The remained thickness of the dielectric between the blind holes 13 equals 50 μm.

Figure 3:
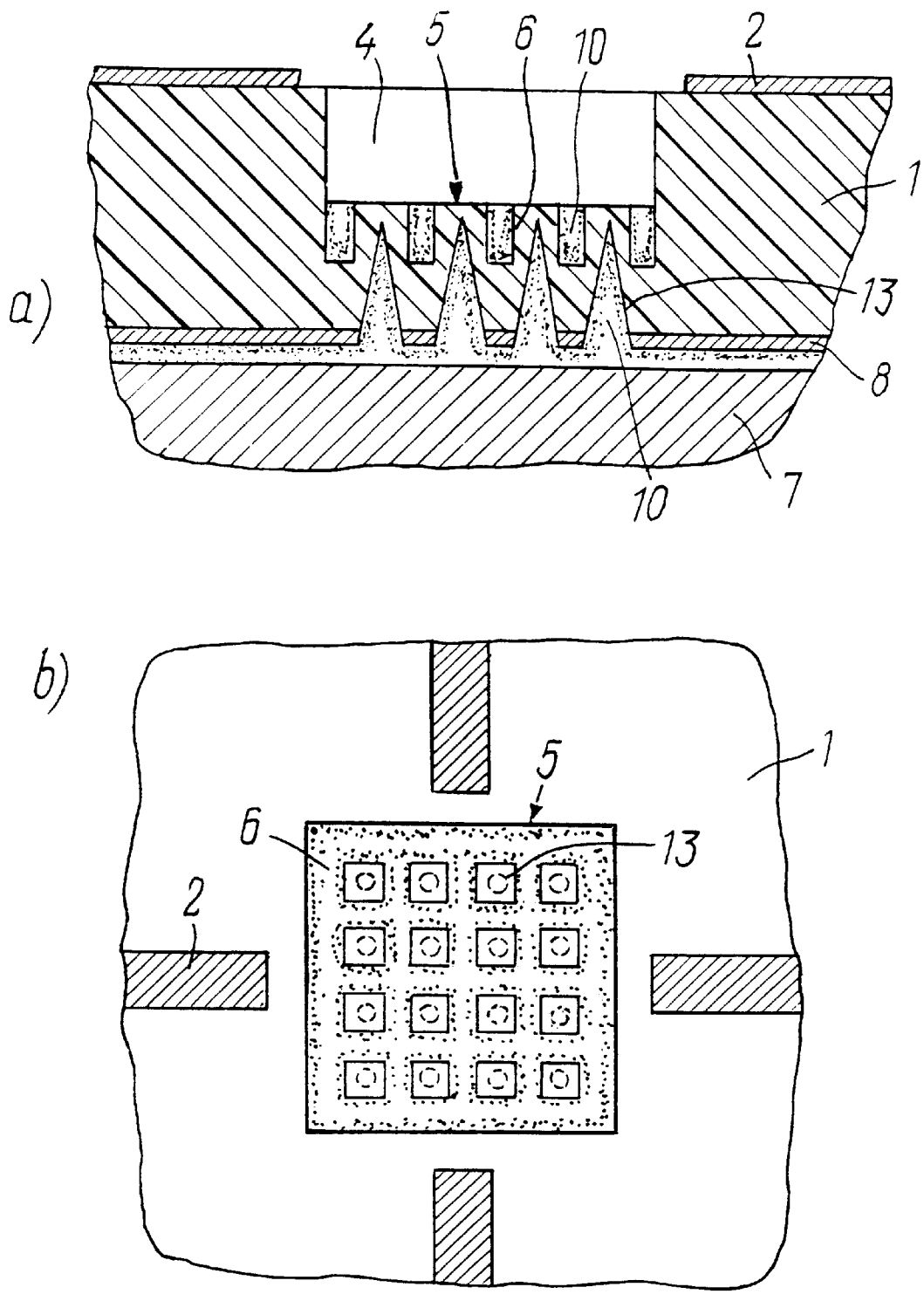
FIG.3a, b is a sectional and plan view of the board of a power hybrid integrated circuit with a system of blind holes in the bottom of the recess in the form of a grate.

The system of the blind holes 6 (FIG.3a, b) in the bottom of the recess 4 may be in the form of a grate having grooves, e.g., 0.1 mm thick with a pitch of 0.2 mm.

Figure 4:
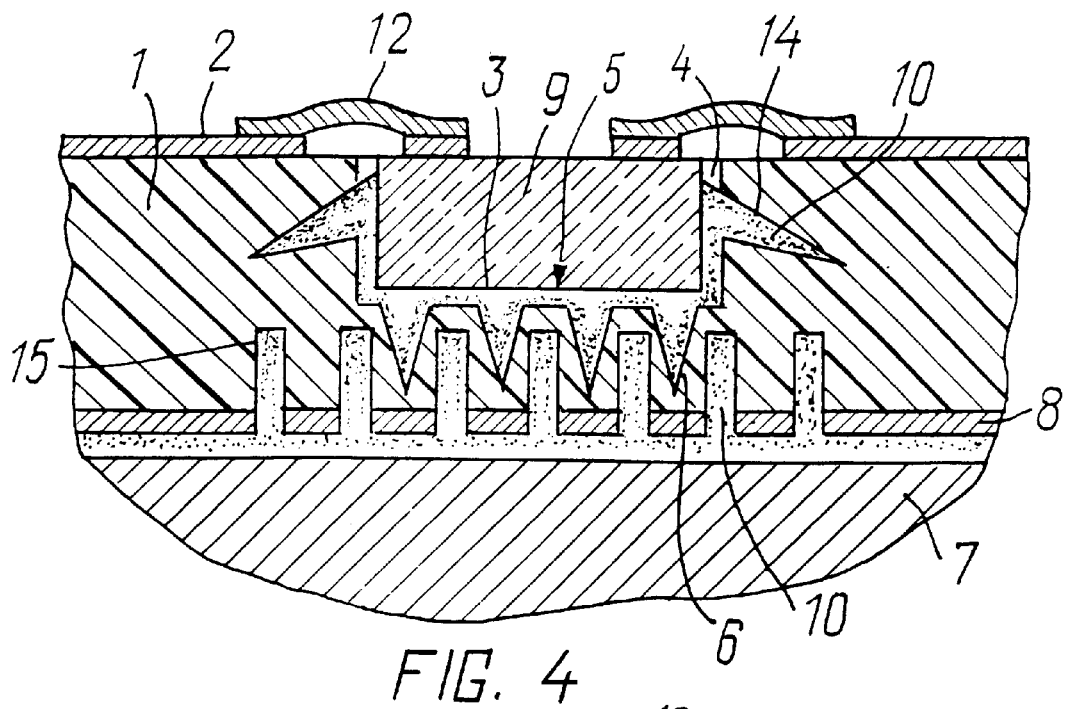
FIG.4 is a sectional view of a power hybrid integrated circuit with additional blind holes on the side face of the recess and a system of blind holes on the back side of the board in the form of a grate.

Additional blind holes 14 (FIG.4) may be provided on the side surface of the recess 4. A system of blind holes 15 may be provided on the back side of the board 1 in the form of a grate having grooves 50 μm wide arranged with a pitch of 0.25 mm.

Figure 5:
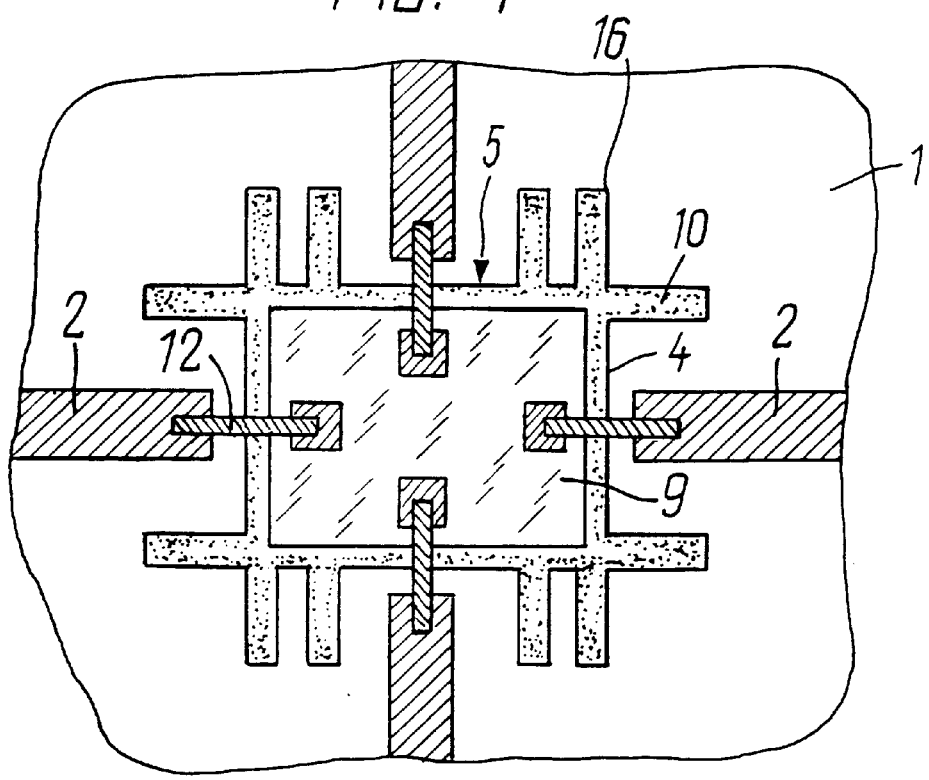
FIG.5 is a plan view of a power hybrid integrated circuit with blind slots along the perimeter of the recess.

Blind slots 16 (FIG.5) are provided on the face side of the board 1 along the perimeter of the recess 4, said slots having, e.g., 0.05×0.5×0.3 mm in size and being filled with the heat conducting material 10.

The recesses 4, the blind holes 6, 13, 14, and 15, and the slots 16 may be metallized, the structure of metallization being, e.g., as follows: Pd—Ni (0.2 μm)—Au (3 μm).

The power hybrid integrated circuit, according to the invention, functions as follows.

While operating the transistor releases heat which is dissipated through the heat dissipating system provided in the remained thickness of the bottom of the recess 4 (FIG.1) and through the side walls of the recess 4, which contributes to a more efficient heat diffusion and increases to the transistor operating reliability.

Using of the filed power hybrid integrated circuit enables to effect electric insulation of the electronic chip 9 device while retaining or even increasing dissipation of heat from the chip 9 through the board 1 and the heat conducting base 7.

Although some specific preferred embodiments of the present invention have been disclosed in the foregoing description, it will be understood that various modifications and improvements may occur which do not however depart from the spirit and scope of the invention.

Industrial Applicability the present invention can be used in designing power hybrid integrated circuits and packages of power semiconductor devices.

What is claimed is:

1. A power hybrid integrated circuit, comprising a double-side metallized dielectric board (1) with a topological metallization pattern (2) on the face side thereof and with at least one mounting pad (3) located in a recess (4) of the face side of the board (1) on a heat sink (5) which is essentially a system of blind holes (6) in the bottom of the recess (4), filled with a heat conducting material (10), the board (1) is joined with its back side to a heat conducting base (7), a naked electronic chip (9) is placed on and fixed to the mounting pad (3) in the recess (4) so that the face surface of the chip (9) is coplanar with the topological metallization pattern (2), CHARACTERIZED in that the holes (6) of the heat sink (5) in the bottom of the recess (4) are blind, the remained thickness of the bottom of said blind holes (6) is from 1 to 999 μm, and spaces between the chip (9) and the side walls of the recess (4) are filled at least partially with the heat conducting material (10).

2. The power hybrid integrated circuit as set forth in claim 1, wherein in that opposing blind holes (13) are provided on the backside of the board (1) between the blind holes (6) in the bottom of the recess (4), said holes (13) being filled with the heat conducting material (10), the remained dielectric thickness between the blind holes (13) being of 1 to 500 μm.

3. The power hybrid integrated circuit as set forth in claim 1, wherein in that the system of the blind holes (6) in the bottom of the recess (4) is in the form of a grate.

4. The power hybrid integrated circuit as set forth in claim 1, wherein in that blind holes (14) are additionally provided on the side surface of the recess (4).

5. The power hybrid integrated circuit as set forth in claim 1, wherein in that the system of blind holes (15) provided on the back side of the board (1) is in the form of a grate.

6. The power hybrid integrated circuit as set forth in claim 1, wherein in that blind slots (16) filled with the heat conducting material (10) are provided on the face surface of the board (1) along the perimeter of the recess (4).

7. The power hybrid integrated circuit as set forth in claim 1 wherein in that the recess (4), the blind holes (6, 13, 14, and 15), and the slots (16) are metallized.

8. The power hybrid integrated circuit as set forth in claim 4, wherein in that the recess (4), the blind holes (6, 13, 14, and 15), and the slots (16) are metallized.

9. The power hybrid integrated circuit as set forth in claim 5, wherein in that the recess (4), the blind holes (6, 13, 14, and 15), and the slots (16) are metallized.

10. The power hybrid integrated circuit as set forth in claim 6, wherein in that the recess (4), the blind holes (6, 13, 14, and 15), and the slots (16) are metallized.

* * * * *